United States Patent [19]

Gillingham

[11] Patent Number: 5,198,708

[45] Date of Patent: Mar. 30, 1993

[54] TRANSITION DETECTION CIRCUIT

[75] Inventor: Peter B. Gillingham, Kanata, Canada

[73] Assignee: Mosaid Inc., Ontario, Canada

[21] Appl. No.: 680,745

[22] Filed: Apr. 5, 1991

[30] Foreign Application Priority Data

Apr. 6, 1990 [GB] United Kingdom ................ 9007786

[51] Int. Cl.$^5$ ........................................... H03K 19/00
[52] U.S. Cl. .................................. 307/480; 307/468;
307/481
[58] Field of Search ............... 307/480, 468, 481, 445,
307/489

[56] References Cited

U.S. PATENT DOCUMENTS 4,970,405 11/1990 Hagiwara ............................ 307/480
5,034,624 7/1991 Flaherty et al. ..................... 307/480

Primary Examiner—Paul M. Dzierzynski
Assistant Examiner—R. A. Ratliff
Attorney, Agent, or Firm—Antonelli, Terry, Stout & Kraus

[57] ABSTRACT

An address transition detection circuit which uses fast inverters in a delay line, avoiding filtering of input pulses and providing significant threshold voltage margin for the input address signal. A pair of gates connected to various points of the delay line detect at at least one point the presence of an address transition passing along the delay line.

8 Claims, 3 Drawing Sheets

TRANSITION DETECTION CIRCUIT

FIELD OF THE INVENTION

This invention relates to semiconductor memory circuits and in particular to an improved address transition detection circuit.

BACKGROUND TO THE INVENTION

Address transition detection circuits (ADT) are employed in both dynamic random access memory (DRAM) circuits and in static random access memory (SRAM) circuits to detect and indicate the presence of stable address input signals. The detection of an address transition is used to trigger internal memory operations. In prior art circuits there is a problem in detecting address transitions when the address input signal is at a DC level which is close to the switching threshold of the detection circuit. Thus false address detection indications may be given, or in some cases the presence of an address may not be detected.

In addition, in prior art ATD circuits serially connected slow delay inverters are used. A short address input pulse may trigger the input circuits of the address transition detector, but it may not propagate through the circuit due to filtering action caused by the slow inverters. This can result in an ATD output pulse which indicates the presence of a stable address input signal which is shorter than required by the memory.

SUMMARY OF THE INVENTION

The present invention is a circuit which solves both of the aforenoted problems. There is a significant input threshold voltage margin provided which allows a wide DC switching margin for the input address signal and provides a clear ATD output signal. In addition, a delay line using fast inverters is utilized, which substantially avoids filtering the input pulses. While in such a system a very short pulse could become "lost" somewhere along the delay line, many points along the delay line are monitored in determining the ATD output, thus ensuring that the short pulse is recognized.

In accordance with an embodiment of the invention, an address transition detection (ATD) circuit is comprised of a pair of input NOR gates having different input voltage thresholds connected to receive an address input signal and a chip select (/CS) input signal or column enable /CE output signal and to provide an output signal upon simultaneous receipt of an address and a /CS signal having complementary logic levels, the thresholds being above and below a nominal input threshold level, a latch, having a pair of inputs for receiving and latching the output signal, and having a pair of outputs, a sequence of fast inverters connected in series from an output of the latch forming a delay line, and a pair of NAND gates having inputs connected to corresponding outputs of the latch, through a fast inverter to opposite outputs of the latch, and to predetermined ones of the fast inverters for detecting at at least one point the presence of an address transition passing along the delay line.

In accordance with another embodiment an ATD circuit is comprised of an automatic transition detector (ATD) circuit comprising an address input, a chip select (/CS or /CE) input, a latch having a pair of inputs, one being an inverting input, and a pair of outputs, first and second NOR gates each having inputs connected to the address and /CS inputs respectively and each having an output connected to a corresponding input of the latch, the NOR gates having different input thresholds, a sequence of fast inverters connected in series from an output of the latch, a first pair of NAND gates each having a plurality of inputs, one input of one NAND gate being connected to one output of the latch and other inputs of the one NAND gate being connected to the outputs of first predetermined ones of a sequence of inverters, one input of the other NAND gate being connected to the other output of the latch and other inputs being connected to the inputs of the predetermined ones of the sequence of inverters, a pair of fast inverters one having an input connected to the one output of the latch and its output connected to an input of the other NAND gate, and the other one of the pair of fast inverters having an input connected to the other output of the latch and its output connected to an input of the one NAND gate, and a third NAND gate having inputs connected to the outputs of the first pair of NAND gates, and an output for carrying a signal representing the detection of an address transition.

In accordance with another embodiment an automatic transition detection (ATD) circuit is comprised of a pair of input NOR gates having different input voltage thresholds connected to receive an address input signal and a chip select (/CS or /CE) input signal for providing a pair of output signals which indicate whether the address input is above both thresholds, below both thresholds, or between the thresholds, a latch, having a pair of inputs for receiving and latching the output signals, two sequences of fast inverters connected in series from each logical output of the latch, to form two equal length delay lines, a pair of NOR gates each having inputs connected to predetermined ones of the fast inverters of a corresponding delay line for detecting at at least one point the presence of an address transition resulting from the address input signal, an output NOR gate having inputs connected to the outputs of the pair of NOR gates, the output of the output NOR gate providing an ATD output lead.

BRIEF INTRODUCTION TO THE DRAWINGS

A better understanding of the invention will be obtained by reference to the detailed description below, in conjunction with the following drawings, in which.

Figure 1:
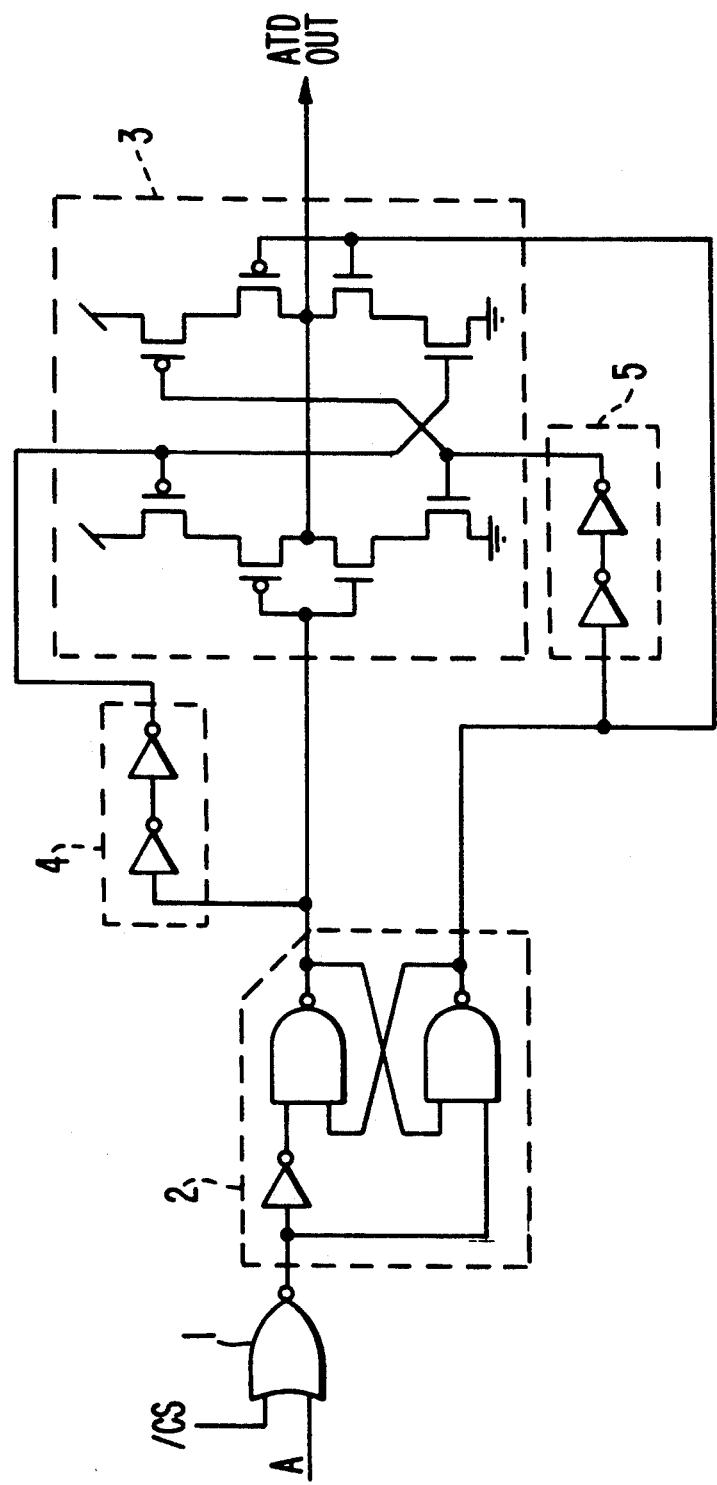
FIG. 1 is a logic diagram of a prior art circuit.

Turning now to FIG. 1, a prior art circuit is shown. Address and column select signals are applied via input terminals A and /CS or /CE respectively to the input of NOR gate 1. The output of the NOR gate is applied to a latch 2, whose outputs are connected to the inputs of a CMOS flip-flop 3. The outputs of latch 2 are also connected to delay lines 4 and 5 and to other inputs of flip-flop 3. Each of the delay lines is formed of a short sequence of slow delay inverters.

In operation, both of the address and /CS or /CE signals receive a logic zero level. This provides an input to latch 2 which operates, sending a signal to flip-flop 3, and a delayed signal also to flip-flop 3. The result is an address transition detection signal at the ATD out lead of a predetermined length which is determined by the difference in time that the latch signal reaches the flip-flop 3 directly from the latch and delayed through delay line 4 or 5.

A continuous transition detect signal at the ATD output is achieved when both the address and /CS or /CE inputs to NOR gate have a logic zero.

Because of the gain of the NOR gate, there is a very small DC margin which affects both paths to the latch. Thus a small variation in the DC level of the input signal can confuse the address transition detection circuit.

Another drawback to the above circuit is caused by the slow delay inverters in the delay line which create a minimum length of an ATD output pulse, requiring a minimum length input pulse.

A short address input pulse may trigger the latch, but this may only propagate part of the way through the delay elements, due to the filtering action of the slow inverters. This results in an ATD output pulse which is shorter than is usually required.

Figure 2:
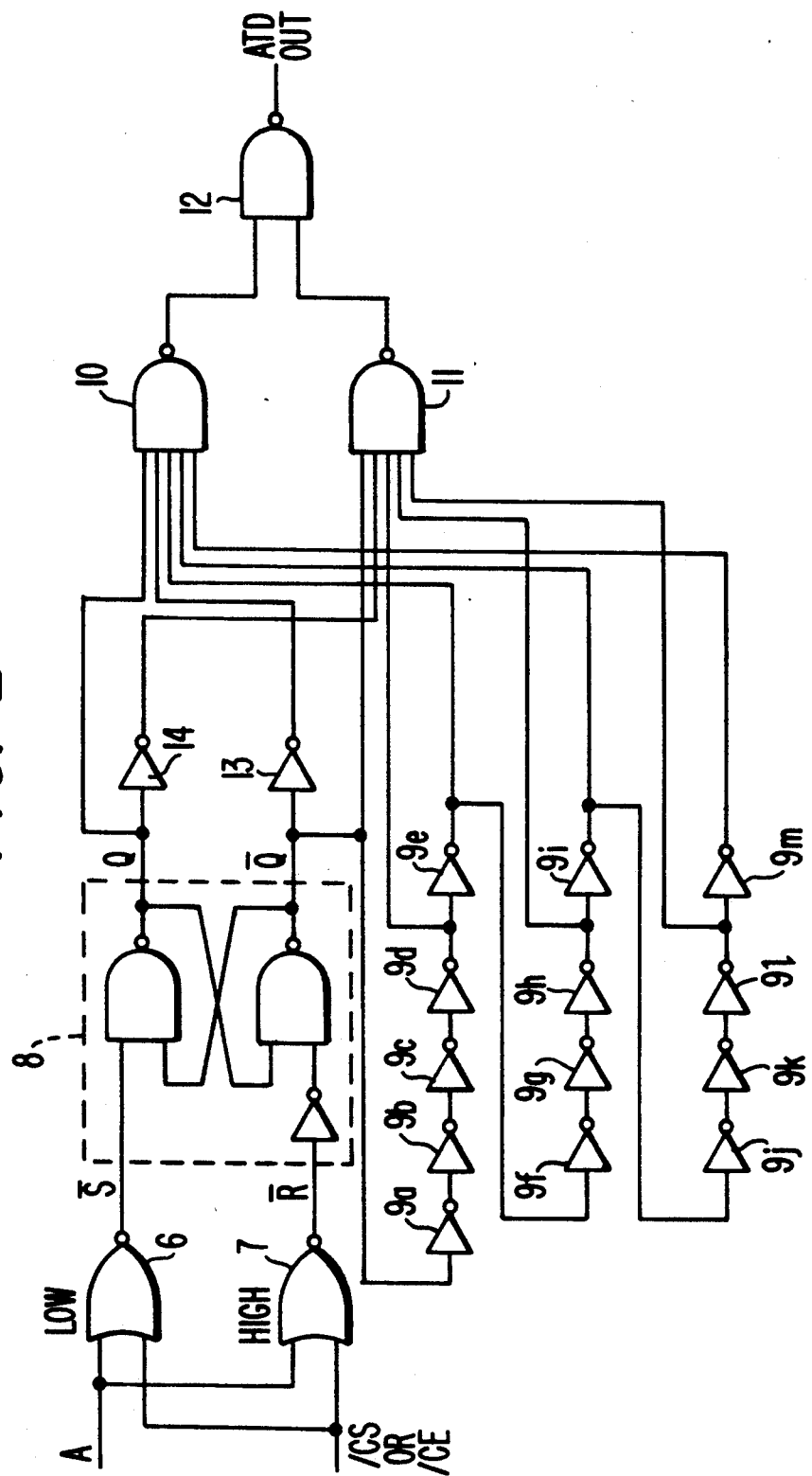
FIG. 2 and FIG. 4 are logic diagrams of embodiments of the present invention.
Figure 3:
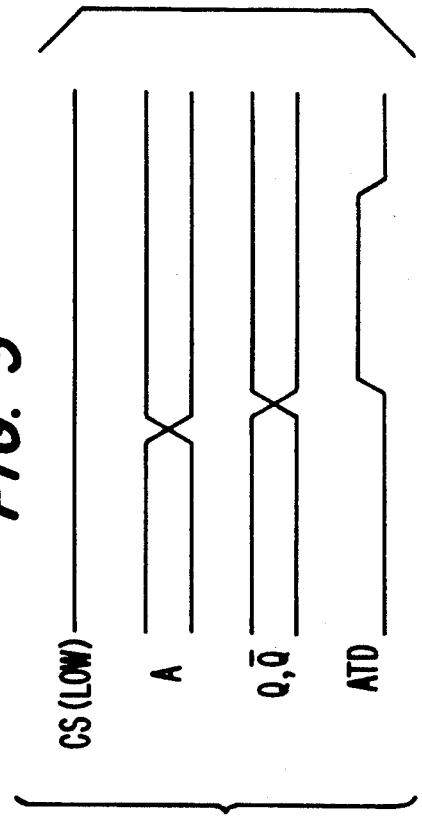
FIG. 3 is a timing diagram showing the operation of the circuit of the present invention.

A preferred embodiment of the present invention is shown in FIG. 2. Signal logic levels at various points in time are shown in FIG. 3. The inputs of a pair of NOR gates 6 and 7 are connected in parallel, and respectively to an address input A and to a chip select input /CS or /CE. The outputs of the NOR gates are connected to corresponding inputs of a latch 8. One of the inputs of latch 8 is an inverting input, as shown.

The thresholds of the NOR gates should be different; for example, in the case of a TTL input signal a low NOR gate threshold of 1.2 volts for NOR gate 6 and a high threshold of 1.6 volts for NOR gate 7 could be used. These thresholds are well within the minimum high input voltage Vih of 2.0 volts and maximum low input voltage Vil of 0.8 volts of a TTL input.

Thus a TTL input signal between the thresholds will cause a simultaneous set and reset of the latch, resulting in a continuous ATD active output.

One output of latch 8 is connected to a delay line comprised of fast inverters 9A–9M connected in series.

The outputs of a pair of NAND gates 10 and 11 are connected to the inputs of NAND gate 12. The output of NAND gate 12, via an inverter 12A, forms the ATD output lead.

One input of NAND gate 10 is connected to an output of latch 8 and other inputs are connected to the outputs of predetermined inverters, in FIG. 2 illustrated as inverter 9e, 9i and 9m. Another input of NAND gate 10 is connected through a fast inverter 13 to the other output of latch 8.

An input of NAND gate 11 is connected to the same output of latch 8 to which the sequence of inverters is connected, and other inputs of NAND gate 11 are connected to the inputs to the same predetermined inverters in the delay line to which the inputs of inverter 10 are connected. Another input of NAND gate 10 is connected through a fast inverter 14 to the output of latch 8 which is connected directly to an input of NAND gate 10.

The input threshold of the latch is thus positioned between the high and low thresholds of the NOR gates 6 and 7. A stable address will be indicated when the latch input exceeds the latch thresholds by an adequate noise margin. Metastable states in the address latch which can produce random results are thus avoided.

The output state of latch 8 is propagated via the delay line formed of inverters 9A–9M. It is possible that a very short pulse could become "lost" along the delay line, i.e. the presence of true pulse is not apparent when observing just the input and output of the delay line. The NAND gates 10 and 11 monitor the delay line, at several points, determined by the connection points of the inputs to NAND gates 10 and 11 along the delay line.

Figure 4:
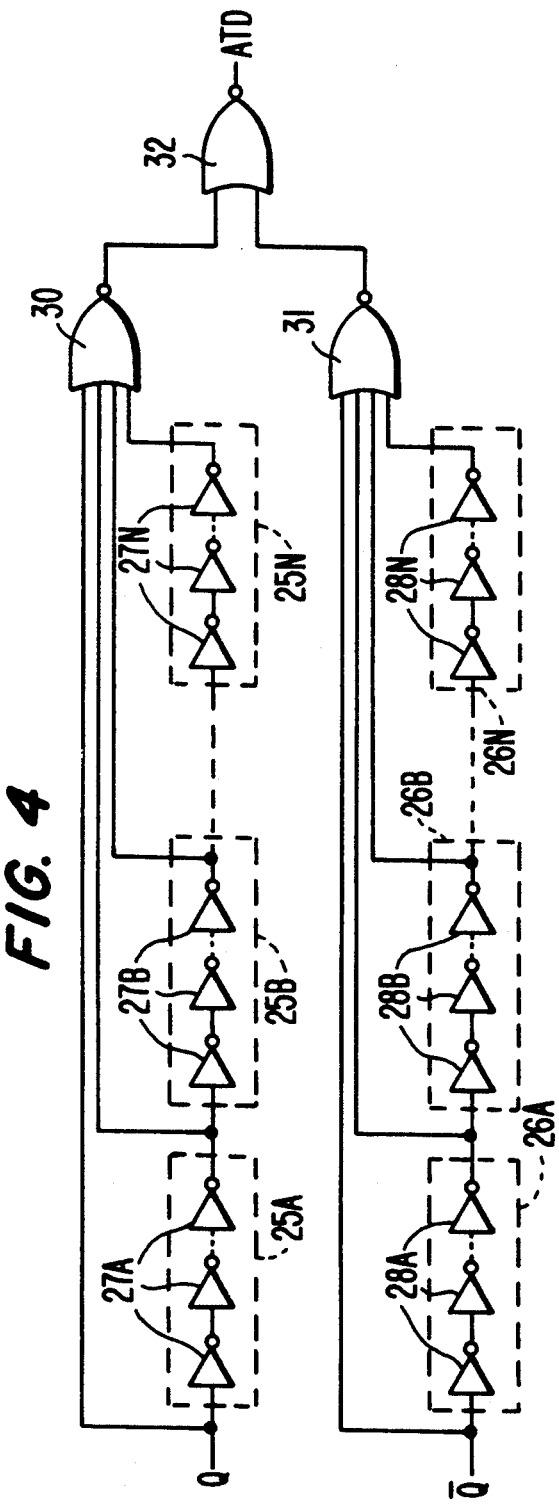

FIG. 4 illustrates a logic diagram of another embodiment of the invention. This embodiment substitutes the circuit shown for the one to the right of the latch 8 in FIG. 2.

A plurality of fast inverters are grouped into two sets of groups 25A, 25B . . . 25N and 26A, 26B . . . 26N. The inverters 27A, 27B . . . 27N in one set are all connected in series and the inverters 28A, 28B . . . 28N in the other set are all connected in series. Each group contains an even number of inverters.

The input of a first set is connected to the Q output of the latch 8 and the input of the other set is connected to the /Q output of the latch. The input and output of the first set are connected to separate inputs of a NOR gate 30 and the outputs of the respective groups 25A, 25B . . . 25N of inverters are connected to other inputs of NOR gate 30. Similarly, the input and output of the other set are connected to respective inputs of a NOR gate 31, and the outputs of respective inverters 26A, 26B . . . 26N are connected to other inputs of NOR gate 31.

The outputs of NOR gates 30 and 31 are connected to the inputs of NOR gate 32; the output of NOR gate 32 forms the ATD output.

In this embodiment also, the output state of latch 8 is propagated via one or the other delay line formed of one or the other set of the groups of inverters. The NOR gates 30 and 31 monitor the delay lines at several points along each delay line. An even number of inverters is required in each group in order that the output logic level of each group should be the same as at its input.

Thus the problem of pulse filtering in slow inverters is solved by using many fast inverters to delay the signal. Because a wide DC margin of the input address signal is tolerated, i.e. between the two input thresholds, dissipating power on useless memory cycles while an input signal is in slow transition is avoided. A minimum ATD output pulse width is guaranteed even under short address glitch conditions. An ATD output pulse which falls short of a minimum value would otherwise cause incorrect memory operation, not allowing sufficient time for precharge, which condition is avoided using the present invention.

The present invention thus provides a substantially improved ATD detection circuit.

A person understanding this invention may now conceive of alternative structures and embodiments or variations of the above. All of those which fall within the scope of the claims appended hereto are considered to be part of the present invention.

We claim:

1. An address transition detection (ATD) circuit comprising:
   (a) a pair of input NOR gates having different input voltage thresholds connected to receive an address input signal and a chip select (/CS or /CE) input signal for providing a pair of output signals which indicate whether the address input is above both thresholds, below both thresholds, or between the thresholds,
   (b) a latch, having a pair of inputs for receiving and latching said output signals, (c) a sequence of fast inverters connected in series from an output of the latch to form a delay line, and (d) a pair of NAND gates having inputs connected to predetermined ones of said fast inverters for detecting at at least one point the presence of an address transition resulting from said address input signal.

2. An ATD circuit as defined in claim 1 further including a third NAND gate having inputs connected to the outputs of the pair of NAND gates and an output for providing an address transition indication signal.

3. An ATD circuit as defined in claim 2 in which said pair of NAND gates are each connected to a corresponding output of the latch, and via a fast inverter, to the other output of the latch.

4. An ATD circuit as defined in claim 3, in which said predetermined ones of said fast inverters are first inverters connected to inputs of one of the pair of NAND gates, their inputs being connected to inputs of the other of the pair of NAND gates.

5. An ATD circuit as defined in claim 4 in which said input gates are a pair of NOR gates each having separate inputs connected in parallel, the parallel inputs being connected for receiving said address and said /CS signals respectively.

6. An automatic transition detection (ATD) circuit comprising:

(a) an address input, (b) a chip select (/CS) or column address enable /CE input, (c) a latch having a pair of inputs and a pair of outputs, (d) first and second NOR gates each having inputs connected to the address and /CS or /CE inputs respectively, said first NOR gate having an output connected to a corresponding input of the latch and said second NOR gate having an output connected to another input of the latch through a first inverter, the NOR gates having different input voltage thresholds, (e) a sequence of fast inverters connected in series from an output of the latch, (f) a first pair of NAND gates each having plural inputs, one input of one NAND gate being connected to one output of the latch and other inputs being connected to the outputs of first predetermined ones of the sequence of inverters, one input of the other NAND gate being connected to the other output of the latch and other inputs being connected to the inputs of said predetermined ones of the sequence of inverters, (g) a pair of fast inverters one having an input connected to the said one output of the latch and its output connected to an input of said other NAND gate, and the other of said pair of fast inverters having an input connected to said other output of the latch and its output connected to an input of said one NAND gate, and (h) a second NAND gate having inputs connected to the outputs of the first pair of NAND gates, and an output for carrying a signal representing detection of an address transaction.

7. An automatic transition detection (ATD) circuit comprising:

(a) a pair of input NOR gates having different input voltage thresholds connected to receive an address input signal and a chip select (/CS or /CE) input signal for providing a pair of output signals which indicate whether the address input is above both thresholds, below both thresholds, or between the thresholds, (b) a latch, having a pair of inputs for receiving and latching said output signals, (c) two sequences of fast inverters connected in series from each logical output of the latch, to form two equal length delay lines, (d) a pair of NOR gates each having inputs connected to predetermined ones of the fast inverters of a corresponding delay line for detecting at at least one point the presence of an address transition resulting from said address input signal, (e) an output NOR gate having inputs connected to the outputs of said pair of NOR gates, the output of said output NOR gate providing an ATD output lead.

8. An ATD circuit as defined in claim 7, in which said pair of NOR gates are connected to said predetermined ones of said fast inverters spaced even numbers of fast inverters apart.

* * * * *